(12) United States Patent
Aiba et al.

(10) Patent No.: US 6,627,479 B2
(45) Date of Patent: Sep. 30, 2003

(54) SEMICONDUCTOR DEVICE HAVING A PLURALITY OF SEMICONDUCTOR ELEMENTS INTERCONNECTED BY A REDISTRIBUTION LAYER

(75) Inventors: Yoshitaka Aiba, Kawasaki (JP); Mitsutaka Sato, Kawasaki (JP); Toshio Hamano, San Jose, CA (US)

(73) Assignee: Fujitsu, Limited, Kawasaki (JP)

(*) Notice: Subject to any disclaimer, the term of this patent is extended or adjusted under 35 U.S.C. 154(b) by 11 days.

(21) Appl. No.: 10/022,572

(22) Filed: Dec. 20, 2001

(65) Prior Publication Data

US 2002/0050639 A1 May 2, 2002

Related U.S. Application Data

(62) Division of application No. 09/493,005, filed on Jan. 28, 2000, now Pat. No. 6,348,728.

(51) Int. Cl.$^7$ .......................... H01L 21/44; H01L 21/48; H01L 21/50
(52) U.S. Cl. .......................... 438/106; 438/113
(58) Field of Search .............................. 438/51, 55, 64, 438/106, 113, 118, 119, 127, 612, 613

(56) References Cited

U.S. PATENT DOCUMENTS

| | | | |
|---|---|---|---|
| 5,355,283 A | 10/1994 | Marrs et al. | 361/760 |
| 5,708,300 A | 1/1998 | Woosley et al. | 257/730 |
| 5,903,443 A | 5/1999 | Schoenfeld et al. | 361/813 |
| 5,994,766 A * | 11/1999 | Shenoy et al. | 257/659 |
| 6,011,314 A * | 1/2000 | Leibovitz et al. | 257/781 |
| 6,025,647 A * | 2/2000 | Shenoy et al. | 257/775 |
| 6,114,751 A | 9/2000 | Kumakura et al. | 257/666 |
| 6,228,684 B1 * | 5/2001 | Maruyama | 438/113 |

* cited by examiner

*Primary Examiner*—David Nhu
(74) *Attorney, Agent, or Firm*—Armstrong, Westerman & Hattori, LLP

(57) ABSTRACT

A plurality of semiconductor chips are incorporated in a one-piece package so as to substantially increase a mounting area of a semiconductor device so that the semiconductor device can be provided with the projection electrodes having a structure which enable the semiconductor device to be mounted by a conventional surface mounting technique. A redistribution layer interconnects and integrally holds the plurality of semiconductor elements. A plurality of projection electrodes are provided on the redistribution layer for surface mounting. The plurality of semiconductor chips are rendered to be different kinds so that the plurality of different kinds of semiconductor chips together provide a complete function. The plurality of semiconductor chips may be rendered to be the same kind so as to reduce a mounting area of the semiconductor chips as a whole.

3 Claims, 11 Drawing Sheets

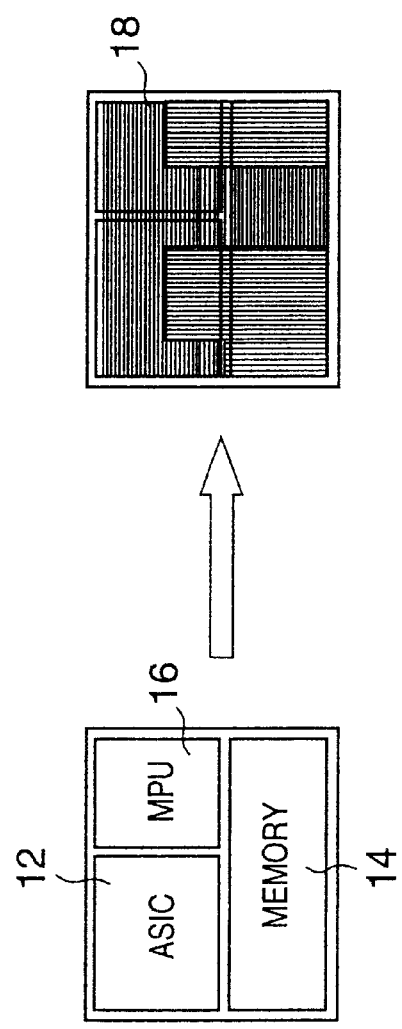
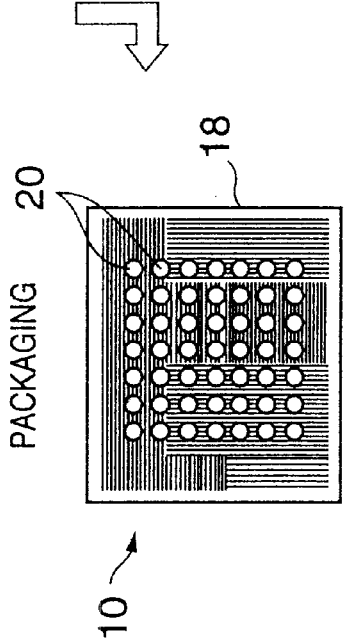
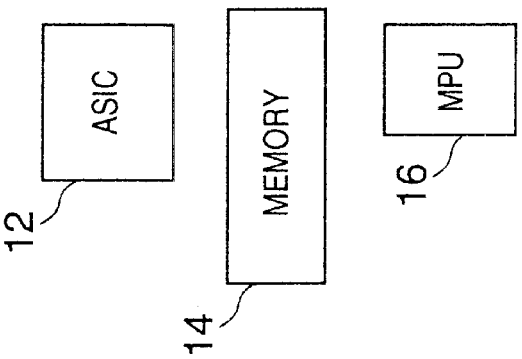

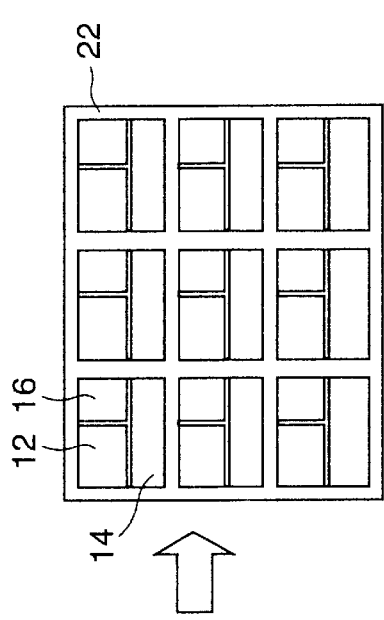
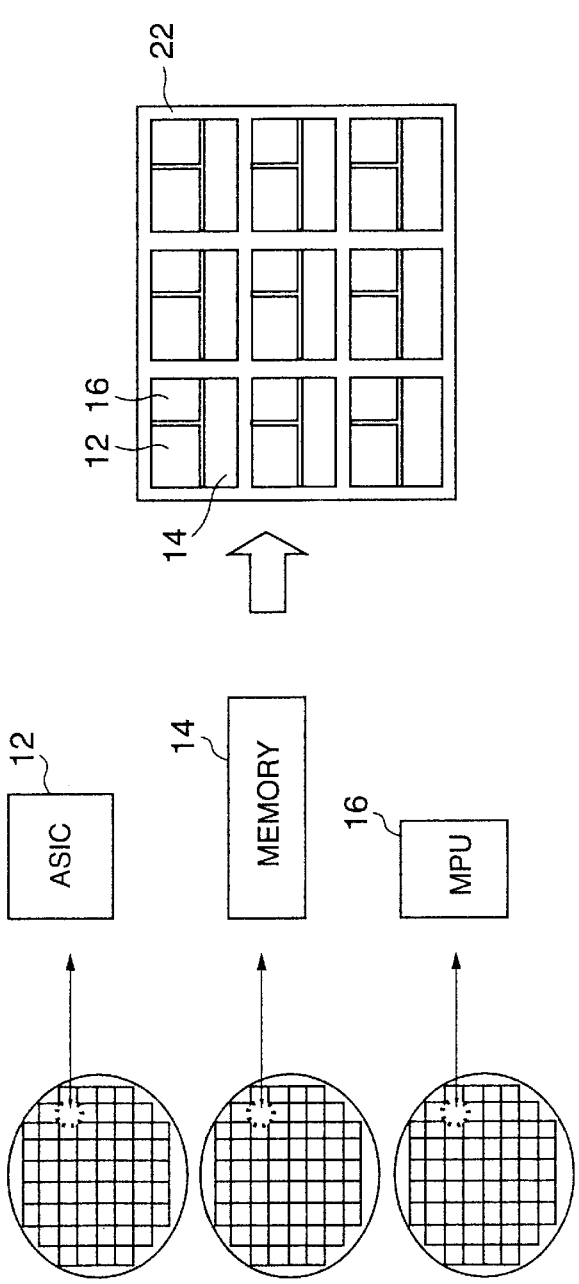
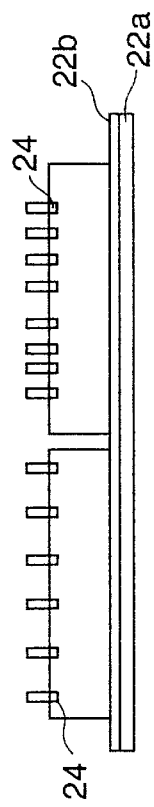
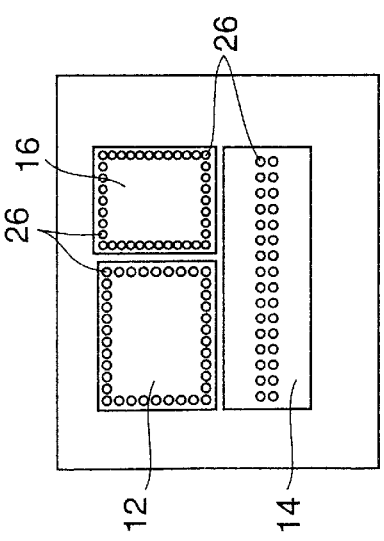

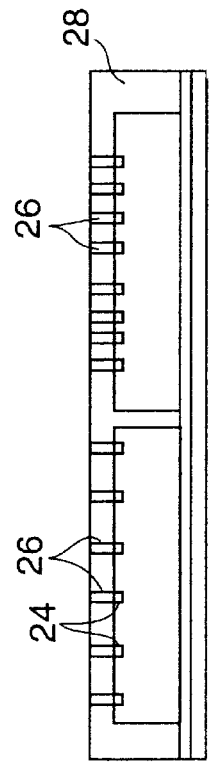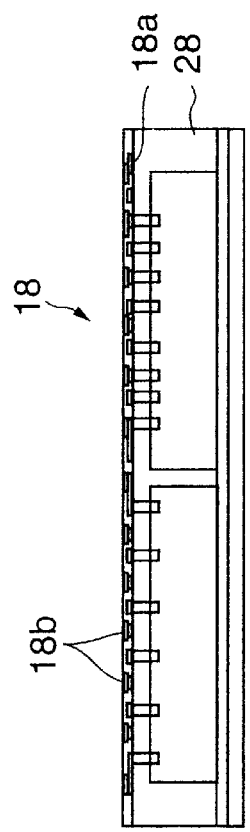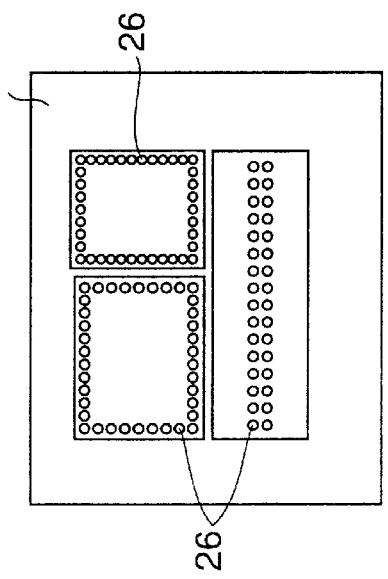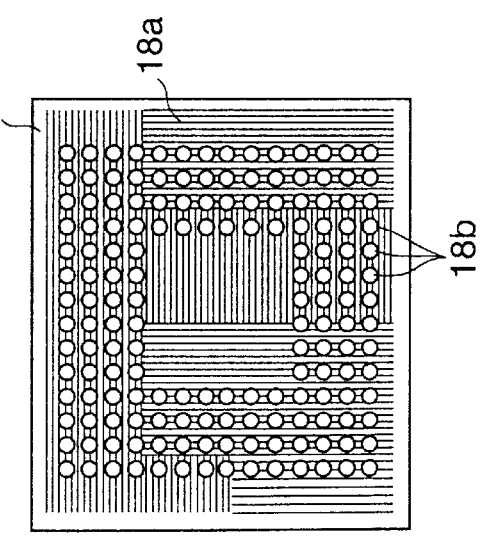

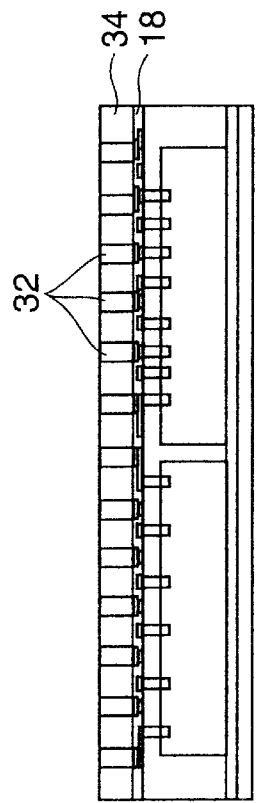
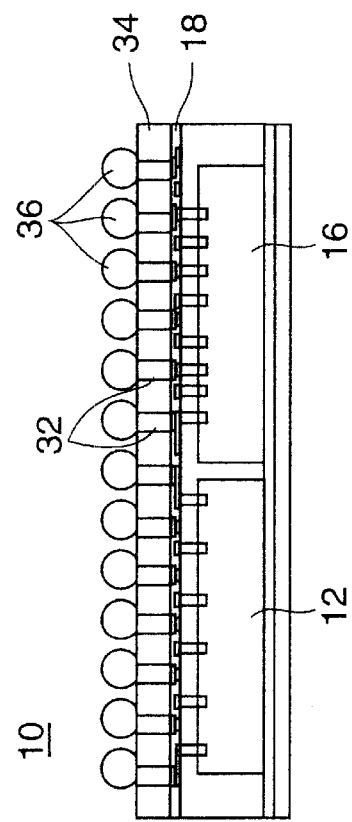
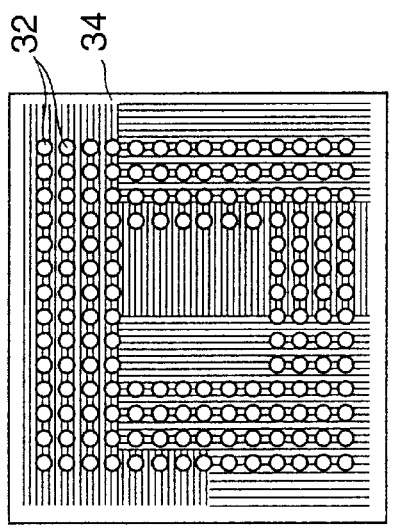
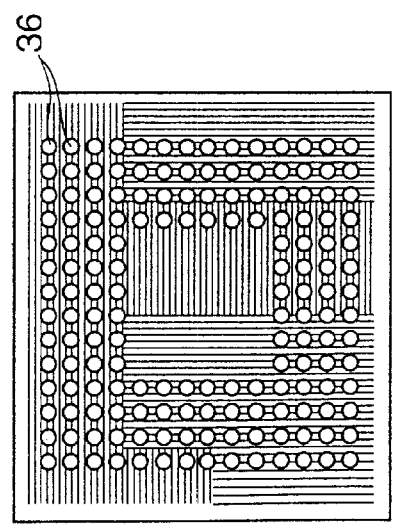

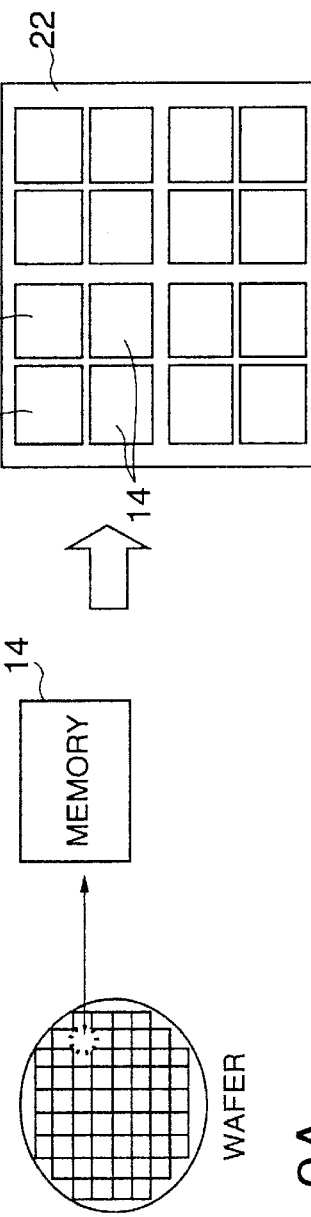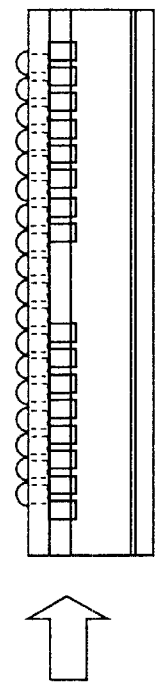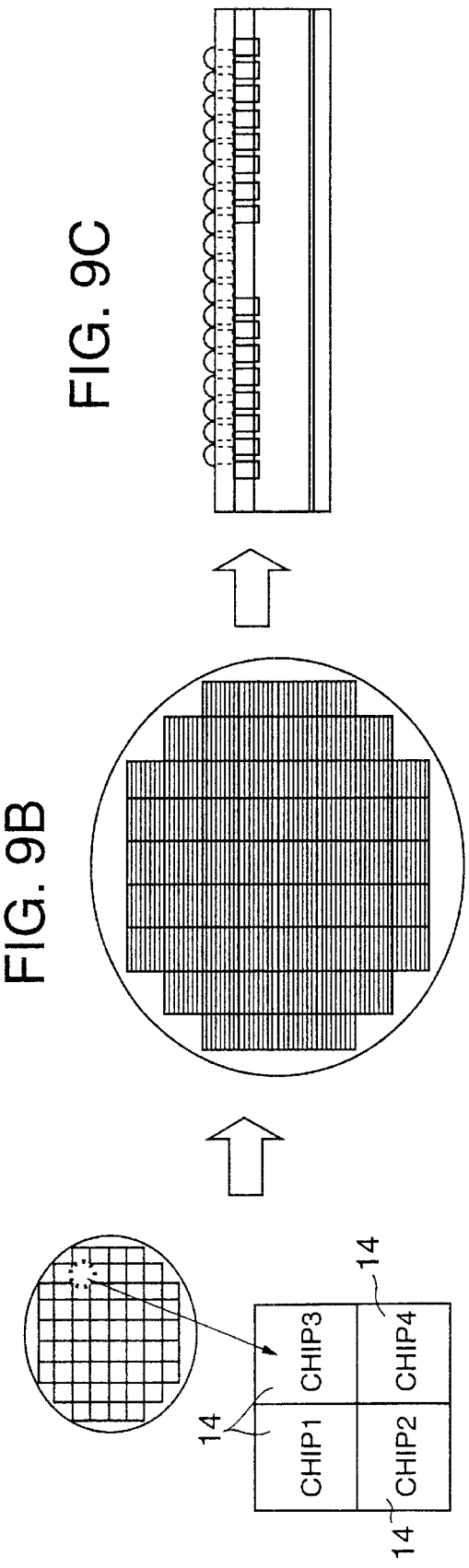

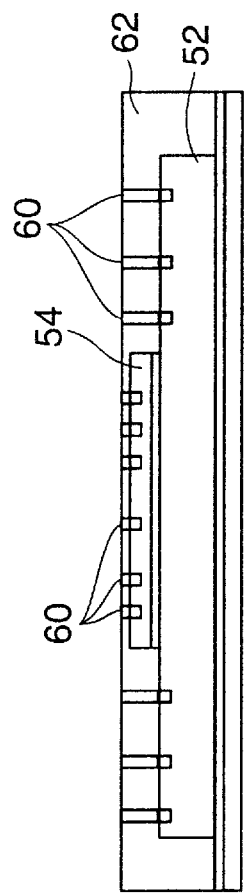
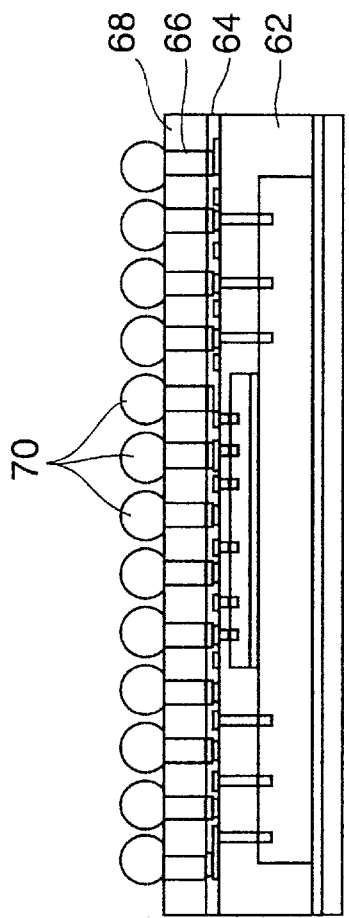
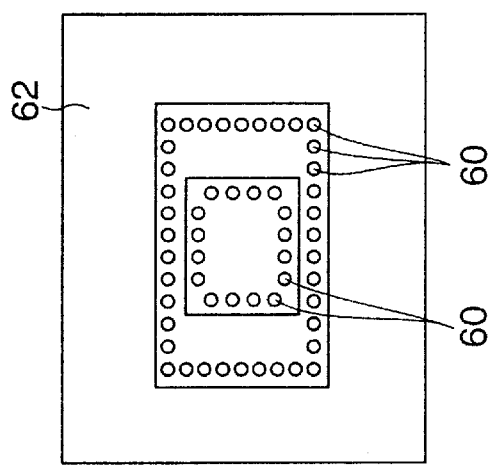
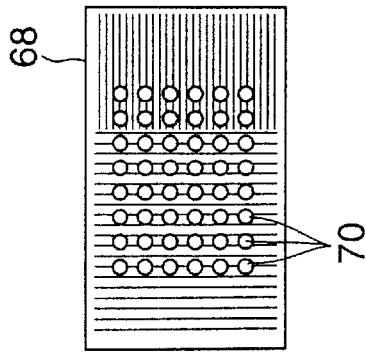

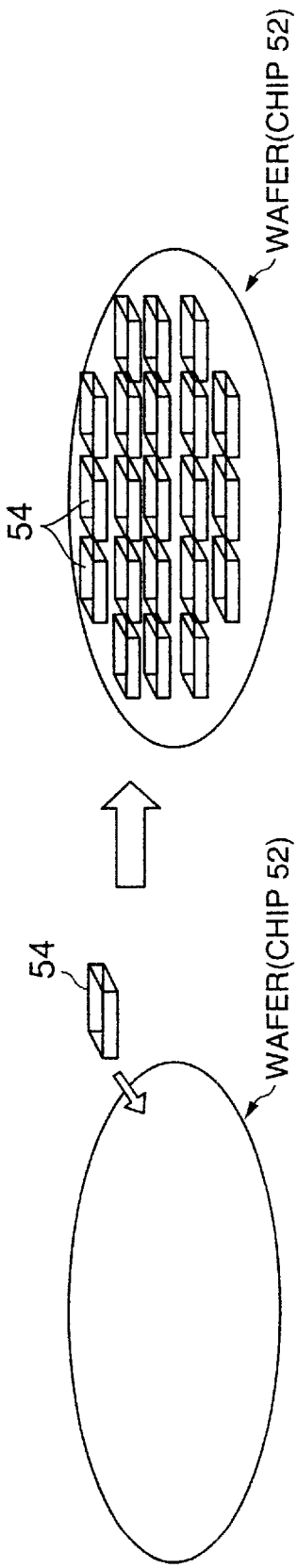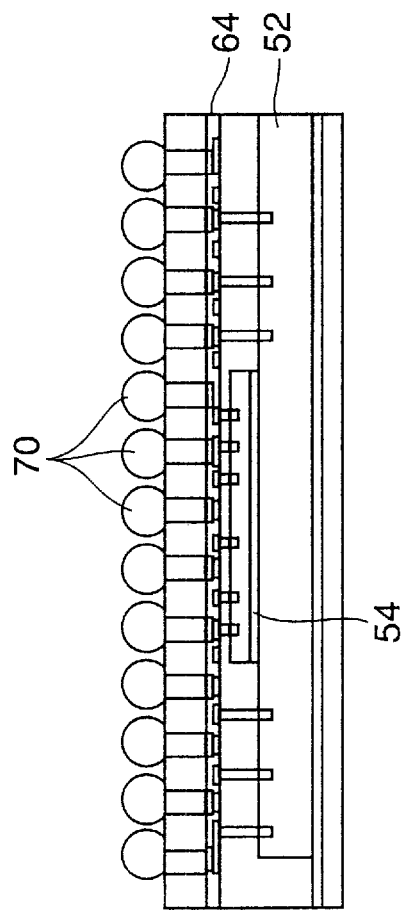

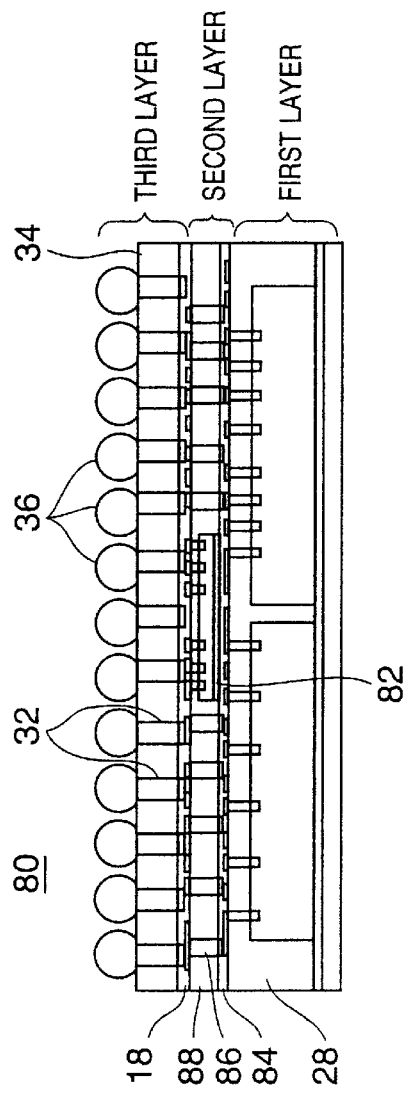
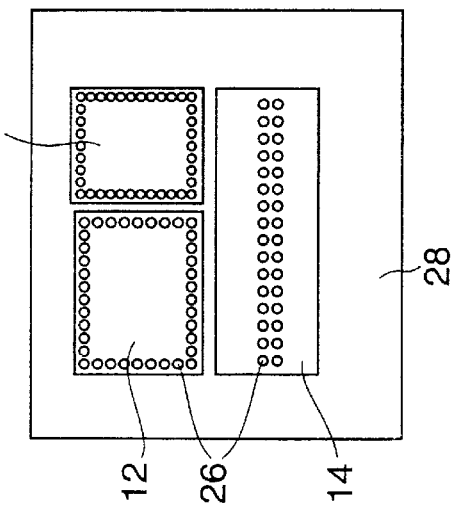
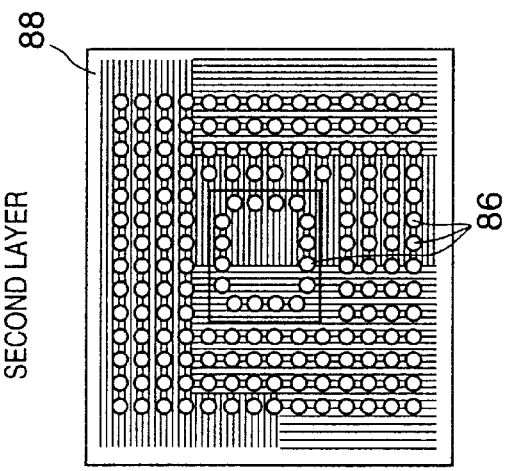
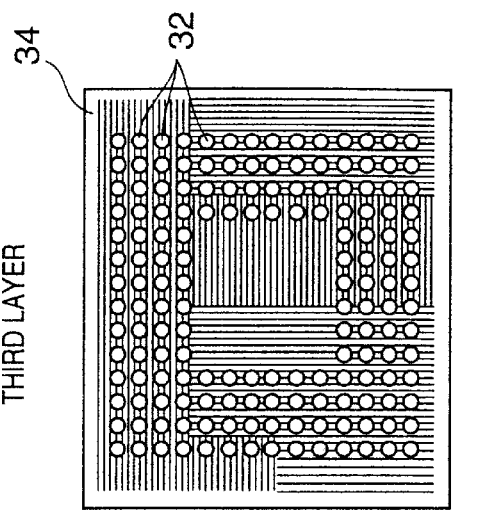

SEMICONDUCTOR DEVICE HAVING A PLURALITY OF SEMICONDUCTOR ELEMENTS INTERCONNECTED BY A REDISTRIBUTION LAYER

This application is a division of prior application Ser. No. 09/493,005 filed Jan. 28, 2000, now U.S. Pat. No. 6,348,728 issued on Feb. 19, 2002.

BACKGROUND OF THE INVENTION

1. Field of the Invention

The present invention generally relates to a semiconductor device and, more particularly, to a surface-mountable semiconductor device having a plurality of semiconductor elements integrated in a one-piece package and a method of manufacturing such a semiconductor device.

2. Description of the Related Art

Recently, high-density integration of semiconductor chips has advanced, and the size of the semiconductor chip has been reduced. Therefore, the pitch of the projection electrodes to mount the semiconductor chip on a circuit board or substrate is also reduced. Arrangement of the projection electrodes for surface mounting has changed from a peripheral arrangement to a so-called area bump arrangement in which the projection electrodes are arranged over the entire mounting surface of the semiconductor chip. Such a surface-mountable semiconductor device is manufactured by forming a redistribution layer (generally referred to as an interposer) on a single semiconductor chip and forming the projection electrodes on the redistribution layer. That is, the mounting surface of the semiconductor device is effectively used by arranging the projection electrodes at appropriate positions on the redistribution layer.

On the other hand, a technique has been developed to cut out each semiconductor chip from a wafer on which a plurality of semiconductor chips are formed after electrodes of each of the semiconductor chip are rearranged. Such a technique is referred to as a wafer level packaging technique.

However, there is a limit in reducing the pitch between the projection electrodes due to the restrictions from the structure of the projection electrodes and the structure of the board to which the semiconductor device is mounted. Accordingly, when the area of the mounting surface is reduced due to the reduction in the size of the semiconductor chip, it becomes difficult to form a necessary number of projection electrodes within the limited mounting area.

That is, if the projection electrodes are provided in the entire mounting area of the semiconductor chip in accordance with the area bump structure, it is difficult to further reduce the size of the semiconductor chip. In such a case, a so-called fan-out structure must be adopted in which the projection electrodes are arranged outside the semiconductor chip. However, the use of the fan-out structure cannot reduce the size of the semiconductor device even though the size of the semiconductor chip is reduced.

Additionally, in a case in which the semiconductor device is fabricated by narrowing the pitch of the projection electrodes to the limit, a high density surface mounting technique must be used to mount such a semiconductor device. Thus, there is a problem in that a user who does not have such a high density surface mounting ability cannot use such a semiconductor device.

SUMMARY OF THE INVENTION

It is a general object of the present invention to provide an improved and useful semiconductor device in which the above-mentioned problems are eliminated.

A more specific object of the present invention is to provide a semiconductor device having a plurality of semiconductor chips incorporated in a one piece package so as to substantially increase the mounting area of the semiconductor device so that the semiconductor device is provided with the projection electrodes having a structure which enable the semiconductor device to be mounted by a conventional surface mounting technique.

In order to achieve the above-mentioned objects, there is provided according to one aspect of the present invention a semiconductor device comprising:

- a plurality of different kinds of semiconductor elements providing a complete function as a whole;
- a redistribution layer interconnecting and integrally holding the plurality of different kinds of semiconductor elements so that the plurality of different kinds of semiconductor elements together provide the complete function; and
- a plurality of projection electrodes provided on the redistribution layer for surface mounting.

According to the above-mentioned invention, because the plurality of semiconductor elements are electrically connected to each other by the redistribution layer and integrated in the same semiconductor device, the plurality of semiconductor elements together can be mounted on a circuit board by mounting the semiconductor device on the circuit board and there is no need to individually mount each of the plurality of semiconductor elements to the circuit board. Thereby, the number of processes required for mounting the semiconductor elements is reduced.

Additionally, because the plurality of semiconductor elements are electrically interconnected by the redistribution layer, a number of projection electrodes necessary for the semiconductor device is smaller than the sum of the number of electrodes on the plurality of semiconductor elements. Accordingly, if the projection electrodes provided to the semiconductor device are formed in accordance with a structure of projection electrodes which enables use of a conventional surface mounting technique, the projection electrodes can be arranged within the mounting surface of the semiconductor device. Additionally, if there is an unoccupied area in one of the mounting surface of the plurality of semiconductor elements, the unoccupied area can be used for mounting other semiconductor chips for which an insufficient mounting area exists, since the mounting surfaces of the plurality of semiconductor chips can be commonly used. Thus, the number of necessary projection electrodes can be formed within the mounting area of the semiconductor device.

Additionally, because the plurality of semiconductor elements are integrated in the one piece package and electrically connected to each other, the mounting area can be reduced to a size less than that in which the plurality of semiconductor elements are individually mounted on the circuit board. That is, there is no need to provide wiring that connects the plurality of semiconductor elements on the circuit board side to which the semiconductor device is mounted, and, thus, the area previously used by the wiring can be eliminated.

Additionally, because the plurality of semiconductor elements are arranged close to each other and are connected by the redistribution layer, the distance between the semiconductor chips are extremely short. Thus, the lengths of signal transmission lines between the semiconductor elements are short, which enables high-speed operation.

In the above-mentioned structure, a complete function can be provided by the plurality of semiconductor elements as a whole by rendering the plurality of semiconductor elements to be different kinds.

Additionally, in the semiconductor device according to the present invention, at least one of the plurality of different kinds of semiconductor elements may be stacked on another one of the plurality of different kinds of semiconductor elements.

Accordingly, a plurality of semiconductor elements can be efficiently accommodated in the package without increasing the mounting area of the semiconductor device.

Additionally, there is provided according to another aspect of the present invention a semiconductor device comprising:

a plurality of the same kind of semiconductor elements;

a redistribution layer interconnecting and integrally holding the plurality of the same kind of semiconductor elements; and a plurality of projection electrodes provided on the redistribution layer for surface mounting.

According to this invention, when a lot of the same kind of semiconductor elements are to be mounted on a circuit board, the plurality of semiconductor elements provided in the semiconductor device are rendered to be the same kind so that a mounting area corresponding to the plurality of semiconductor elements is reduced.

Additionally, the plurality of the same kind of semiconductor elements may be formed on the same wafer and cut out from the wafer in one piece. Accordingly, a process of cutting out an individual semiconductor element can be eliminated. Additionally, since an accurate positional relationship in a wafer state can be maintained, a process of positioning the plurality of semiconductor elements can be simplified.

Additionally, there is provided according to another aspect of the present invention a manufacturing method of a semiconductor device, comprising the steps of:

arranging a plurality of semiconductor elements adjacent to each other;

forming a redistribution layer over the plurality of semiconductor elements so as to interconnect and integrally hold the plurality of semiconductor elements; and forming a plurality of projection electrodes on the redistribution layer for surface mounting.

According to the above-mentioned invention, since the plurality of semiconductor elements are electrically connected to each other by the redistribution layer and integrated in the same semiconductor device, the plurality of semiconductor elements together can be mounted on a circuit board by mounting the semiconductor device on the circuit board and there is no need to individually mounting each of the plurality of semiconductor elements to the circuit board. Thereby, the number of processes for mounting the semiconductor elements is reduced.

Additionally, since the plurality of semiconductor elements are electrically interconnected by the redistribution layer, a number of projection electrodes necessary for the semiconductor device is smaller than the sum of the number of electrodes on the plurality of semiconductor elements. Accordingly, if the projection electrodes provided to the semiconductor device are formed in accordance with a structure of projection electrodes which enables use of a conventional surface mounting technique, the projection electrodes can be arranged within the mounting surface of the semiconductor device. Additionally, if there is an unoccupied area in one of the mounting surface of the plurality of semiconductor elements, the unoccupied area can be used for other semiconductor chips having an insufficient mounting area since the mounting surfaces of the plurality of semiconductor chips can be commonly used. Thus, the number of necessary projection electrodes can be formed within the mounting area of the semiconductor device.

Additionally, since the plurality of semiconductor elements are integrated in the one piece package and electrically connected to each other, the mounting area can be reduced less than that when the plurality of semiconductor elements are individually mounted on the circuit board. That is, there is no need to provide wiring that connects the plurality of semiconductor elements on the circuit board side to which the semiconductor device is mounted, and, thus, the area occupied by the wiring can be eliminated or used for other purposes.

Additionally, since the plurality of semiconductor elements are arranged close to each other and are connected by the redistribution layer, the distances between the semiconductor chips are extremely short. Thus, the lengths of signal transmission lines between the semiconductor elements are short, which enables a high-speed operation.

Additionally, there is provided according to another aspect of the present invention a manufacturing method of a semiconductor device, comprising the steps of:

forming a plurality of semiconductor elements on a wafer;

forming a redistribution layer on the wafer so as to electrically interconnect a predetermined number of the semiconductor elements formed on the wafer;

cutting out the predetermined number of the semiconductor elements from the wafer in one piece; and forming a plurality of projection electrodes on the redistribution layer for surface mounting.

According to this invention, since the predetermined number of semiconductor elements are cut out from the wafer in one piece, a process of cutting out individual semiconductor elements can be eliminated. Additionally, since an accurate positional relationship in a wafer state can be maintained, a process of positioning the plurality of semiconductor elements can be simplified.

Additionally, there is provided according to another aspect of the present invention a manufacturing method of a semiconductor device, comprising the steps of:

placing a first semiconductor element on an electrode surface of a second semiconductor element and fixing the first semiconductor element to the second semiconductor element, the first semiconductor device being smaller than the second semiconductor element;

forming a redistribution layer over the first and second semiconductor elements so as to electrically interconnect the first and second semiconductor elements; and forming a plurality of projection electrodes on the redistribution layer for surface mounting.

According to this invention, since the first semiconductor element is stacked on the second semiconductor element, the first and second semiconductor elements can be efficiently accommodated in the package without increasing the mounting area of the semiconductor device.

BRIEF DESCRIPTION OF THE DRAWINGS

FIGS. 1A, 1B, 1C and 1D are illustrations for explaining a manufacturing process of a semiconductor device according to a first embodiment of the present invention;

FIGS. 2A and 2B are illustrations for explaining the arrangement of a plurality of semiconductor chips in the semiconductor device according to the first embodiment of the present invention;

FIGS. 3A and 3B are illustrations of the semiconductor device according to the first embodiment of the present invention in a state in which copper posts are formed;

FIGS. 4A and 4B are illustrations of the semiconductor device according to the first embodiment of the present invention in a state in which the copper posts and the semiconductor chips are sealed;

FIGS. 5A and 5B are illustrations of the semiconductor device according to the first embodiment of the present invention in a state in which a redistribution layer is formed;

FIGS. 6A and 6B are illustrations of the semiconductor device according to the first embodiment of the present invention in a state in which copper posts are formed on the redistribution layer;

FIGS. 7A and 7B are illustrations of the semiconductor device according to the first embodiment of the present invention in a state in which solder balls are formed on the copper posts;

FIGS. 8A, 8B and 8C are illustrations for explaining the arrangement of a plurality of semiconductor chips in a semiconductor device according to a second embodiment of the present invention;

FIGS. 9A, 9B and 9C are illustrations for explaining a manufacturing process of the semiconductor device according to the second embodiment of the present invention;

FIGS. 15A and 15B are illustrations of the semiconductor device according to the third embodiment of the present invention in a state in which the surface of the sealing resin is polished;

FIGS. 16A and 16B are illustrations of the semiconductor device according to the third embodiment of the present invention in a state in which solder balls are formed on the copper posts;

FIG. 17 is an illustration for explaining a process of stacking a semiconductor chip on a semiconductor chip in a wafer state;

FIG. 18 is an illustration of the semiconductor device according to the third embodiment of the present invention in a state in which solder balls are formed;

FIG. 19 is an illustration of a semiconductor device according to a fourth embodiment of the present invention; and FIGS. 20A, 20B and 20C are illustrations for explaining a layered structure of the semiconductor device according to the fourth embodiment of the present invention.

DETAILED DESCRIPTION OF THE PREFERRED EMBODIMENTS

Figure 10:
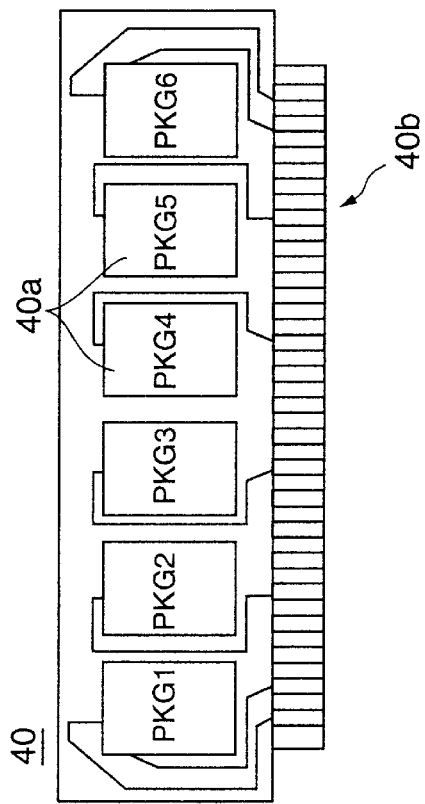
FIG. 10 is a plan view of a memory module having a plurality of memory chips.

A description will now be given of a first embodiment of the present invention. FIGS. 1A, 1B, 1C and 1D are illustrations for explaining a manufacturing process of a semiconductor device according to the first embodiment of the present invention.

The semiconductor device 10 according to the first embodiment of the present invention comprises a plurality of semiconductor chips as shown in FIG. 1B. That is, the semiconductor chip 10 comprises an application specification integrated circuit (ASIC) 12, a memory 14 and a microprocessor (MPU) 16 integrated in a one-piece package. As shown in FIG. 1C, the ASIC 12, the memory 14 and the MPU 16 are electrically interconnected by a redistribution layer 18 that is generally referred to as an interposer. The redistribution layer 18 serves to integrally hold the ASIC 12, the memory 14 and the MPU 16. Additionally, the redistribution layer 18 interconnects the ASIC 12, the memory 14 and the MPU 16, and provides electrode pads connected to the ASIC 12, the memory 14 and the MPU 16 so that terminals for external connection can be formed on the electrode pads. The wiring patterns provided on the redistribution layer 18 extend over the ASIC 12, the memory 14 and the MPU 16. Thus, the ASIC 12, the memory 14 and the MPU 16 are operatively coupled to each other so that the semiconductor device 10 solely provides a desired complete function. After the redistribution layer 18 is formed, a plurality of projection electrodes 20 for surface mounting are provided by the redistribution layer 18.

In the above-mentioned structure, since the projection electrodes 20 are formed after the plurality of semiconductor chips having different functions are integrated and electrically connected to each other, the semiconductor device 10 can be mounted on a circuit board and there is no need to individually mount each of the semiconductor chips on the circuit board. That is, by using the semiconductor device 10, the ASIC 12, the memory 14 and the MPU 16 can be mounted on the circuit board by the same process while the ASIC 12, the memory 14 and the MPU 16 must be individually mounted on the circuit board in the conventional technique. Thus, the number of mounting processes is reduced.

Additionally, since in the semiconductor device 10 the plurality of semiconductor chips are electrically connected to each other by the redistribution layer 18, the number of projection electrodes 20 necessary for the semiconductor device 10 is smaller than the sum of the number of electrodes on the plurality of semiconductor chips is mounted individually in the conventional manner. Accordingly, if the projection electrodes 20 provided to the semiconductor device 10 are formed in accordance with a structure which enables use of a conventional surface mounting technique, the projection electrodes 20 can be arranged within the mounting surface of the semiconductor device 10. Additionally, if there is an unoccupied area in one of the mounting surface of the plurality of semiconductor chips, the unoccupied area can be used for other semiconductor chips having an insufficient mounting area, since the mounting surfaces of the plurality of semiconductor chips can be commonly used. Thus, the number of necessary projection electrodes can be formed within the mounting area of the semiconductor device 10.

Since the plurality of semiconductor chips are integrated in the package and electrically connected to each other, the mounting area can be reduced to less than that when the plurality of semiconductor chips are individually mounted on the circuit board. That is, there is no need to provide wiring that connects the plurality of semiconductor chips on the circuit board side to which the semiconductor device 10 is mounted, and, thus, the area previously occupied by the wiring can be eliminated.

Additionally, in the semiconductor device 10, since the ASIC 12, the memory 14 and the MPU 16 are arranged close to each other and are connected by the redistribution layer 18, the distances between the semiconductor chips are extremely short. Thus, the lengths of signal transmission lines between the semiconductor chips are short, which enables a high-speed operation.

It should be noted that in the present embodiment, although the semiconductor device performs a complete function by being provided with the ASIC 12, the memory 14 and the MPU 16, the present invention is not limited to this structure. That is, for example, a part of a function may be performed by a plurality of semiconductor chips provided in the semiconductor device.

A description will now be given, with reference to FIGS. 2A and 2B through FIGS. 7A and 7B, of a manufacturing process of the semiconductor device 10.

As shown in FIG. 2A, the ASIC 12, the memory 14 and the MPU 16 are prepared each of which is cut out from the respective wafers. Next, as shown in FIG. 2(b), the ASIC 12, the memory 14 and the MPU 16 are attached to a mounting jig 22. Hereinafter, each of the ASIC 12, the memory 14 and the MPU 16 is referred to as a semiconductor chip. The mounting jig 22 is formed by a metal plate 22a on which an adhesive sheet 22b is applied. Each of the semiconductor chips is attached to the jig 22 so that the back surface opposite to the electrode surface is applied to the adhesive sheet 22b of jig 22 so that the electrode surface is exposed.

Thereafter, a photoresist layer is formed on the electrode surface of each of the semiconductor chips. The photoresist layer is patterned by etching so as to expose only electrode pads 24 as shown in FIGS. 3A and 3B. Then, copper posts 26 having a predetermined height are formed, as shown in FIGS. 3A and 3B, on the electrode pads 24 by an electroless plating method.

After the copper posts 26 are formed on the electrodes 24 of each of the semiconductor chips, each of the semiconductor chips and the copper posts 26 together are sealed by a sealing resin 28 as shown in FIGS. 4A and 4B. Thereafter, the surface of the cured sealing resin 28 is flattened by polishing according to a chemical mechanical polishing (CMP) method so that the copper posts 26 appear in the polished surface of the sealing resin 28. Then, the redistribution layer 18 is formed on the surface of the sealing resin 28.

The redistribution layer 18 is formed by a known semiconductor manufacturing process. As shown in FIGS. 5A and 5B, the redistribution layer 18 includes a wiring pattern 18a which interconnects the copper posts 26 of the semiconductor chips and lands 18b on which copper posts for external connection are formed.

Thereafter, copper posts 32 are formed on the lands 18b exposed on the surface of the redistribution layer 18 as shown in FIGS. 6A and 6B. The thus-formed copper posts 32 are sealed by a sealing resin 34 similar to the sealing resin 28. Then, the surface of the sealing resin 34 is polished according to the CMP method. Thereafter, as shown in FIGS. 7A and 7B, solder balls 36 are formed as projecting electrodes on the copper posts 32 exposed in the surface of the sealing resin 34, and the semiconductor device 10 is completed.

It should be noted that the mounting jig 22 may be removed at this time, or retained for use as a reinforcing member or a heat releasing member of the semiconductor device 10.

A description will now be given, with reference to FIGS. 8A, 8B and 8C, of a second embodiment of the present invention. FIGS. 8A, 8B and 8C are illustrations for explaining a semiconductor device according to the second embodiment of the present invention. The semiconductor device according to the second embodiment of the present invention has a structure in which a plurality of the same kind of semiconductor chips are integrated in a one-piece package. In the example shown in FIGS. 8A, 8B and 8C, four memories 14 are integrated and electrically connected to each other.

That is, the four memories 14 cut out from a wafer are arranged close to each other on the mounting jig 22, and the semiconductor device is formed in the same manner as that of the first embodiment of the present invention. Accordingly, the four memories 14 are electrically connected to each other and integrally held by the redistribution layer. In this case, since the plurality of the same kind of semiconductor chips are integrally held, electrodes common to the semiconductor chips are gathered into a single electrode. Accordingly, the number of electrodes of the semiconductor device as a whole can be reduced.

In a case in which a plurality of the same kind of semiconductor chips are used as in the present embodiment, the redistribution layer may be formed in a state in which the semiconductor chips remain on a wafer as shown in FIGS. 9A, 9B and 9C. That is, generally, a plurality of semiconductor chips are formed on a single wafer, and each semiconductor chip is cut out from the wafer. In this embodiment, the redistribution layer is formed on each of the semiconductor chips at the same time before each semiconductor chip is cut out from the wafer. In FIGS. 9A, 9B and 9C, four semiconductor chips together are cut out, are attached to the mounting jig 22.

As mentioned above, by forming the redistribution layer 18 in a wafer state, the process for cutting the individual semiconductor chip and arranging the separate semiconductor device on the mounting jig in a predetermined positional relationship can be eliminated. Additionally, the positional relationship between the semiconductor chips included in the same semiconductor device can be maintained constant.

Processes after the semiconductor chips are attached to the mounting jig 22 are the same as that of the semiconductor device 10 according to the first embodiment of the present invention, and descriptions thereof will be omitted.

Figure 11B:
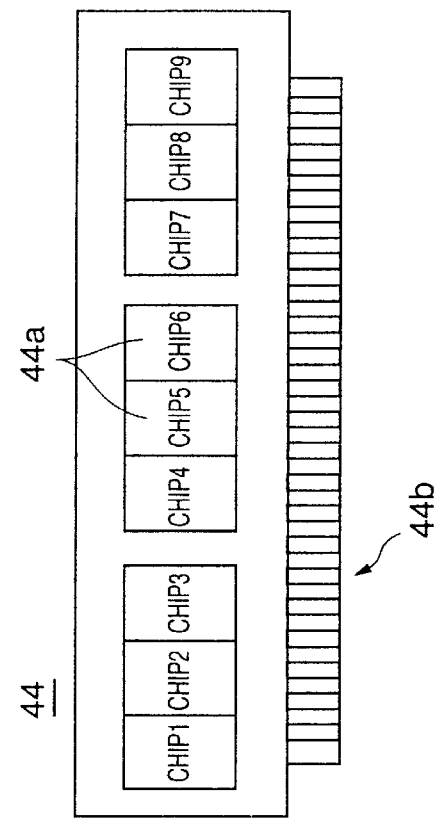
FIG. 11B is a plan view of a memory module having a plurality of memory devices according to the second embodiment of the present invention.
Figure 11A:
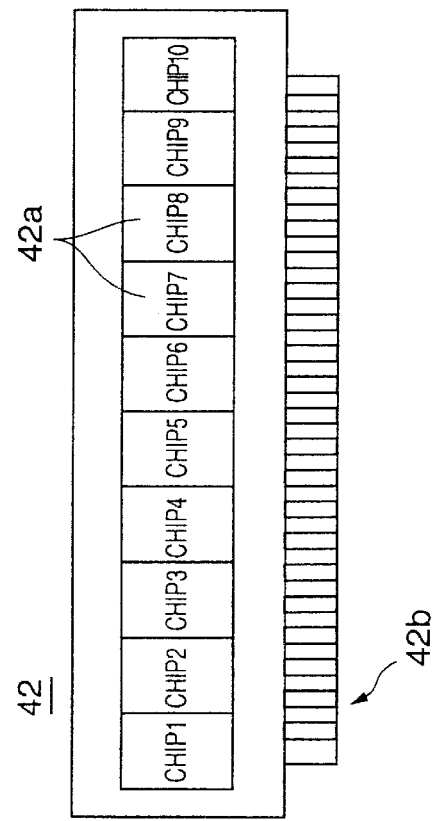
FIG. 11A is a plan view of a memory module having a memory device according to the second embodiment of the present invention.

A description will now be given of a case in which the semiconductor device according to the second embodiment of the present invention is applied to a memory module. FIG. 10 is a plan view of a memory module having a plurality of individually packaged memory chips. FIGS. 11A and 11b are plan views of memory modules having a plurality of memory chips that integrally cut out from a wafer after being provided with a redistribution layer in the wafer state.

The memory module 40 shown in FIG. 10 requires wiring between each of the memory chip packages 40a to external connection terminals 40b of the memory module 40 on an individual memory chip basis. Accordingly, wiring patterns must be provided between the memory chip packages 40a.

On the other hand, the memory module 42 shown in FIG. 11A is formed by integrally cutting out ten memory chips 42a after providing the redistribution layer in the wafer state. Accordingly, there is no need to provide wiring patterns between the memory chips 42a. Thus, the memory module 42 shown in FIG. 11A can contain more memory chips than the memory module 40 shown in FIG. 10 having the same size.

Additionally, the memory module 44 shown in FIG. 11B is formed by integrally cutting out three memory chips 44a after providing the redistribution layer in the wafer state. Accordingly, there is no need to provide wiring patterns between the three memory chips 44a. Thus, the memory module 44 shown in FIG. 11B can contain more memory chips than the memory module 40 shown in FIG. 10 having the same size.

Figure 12:
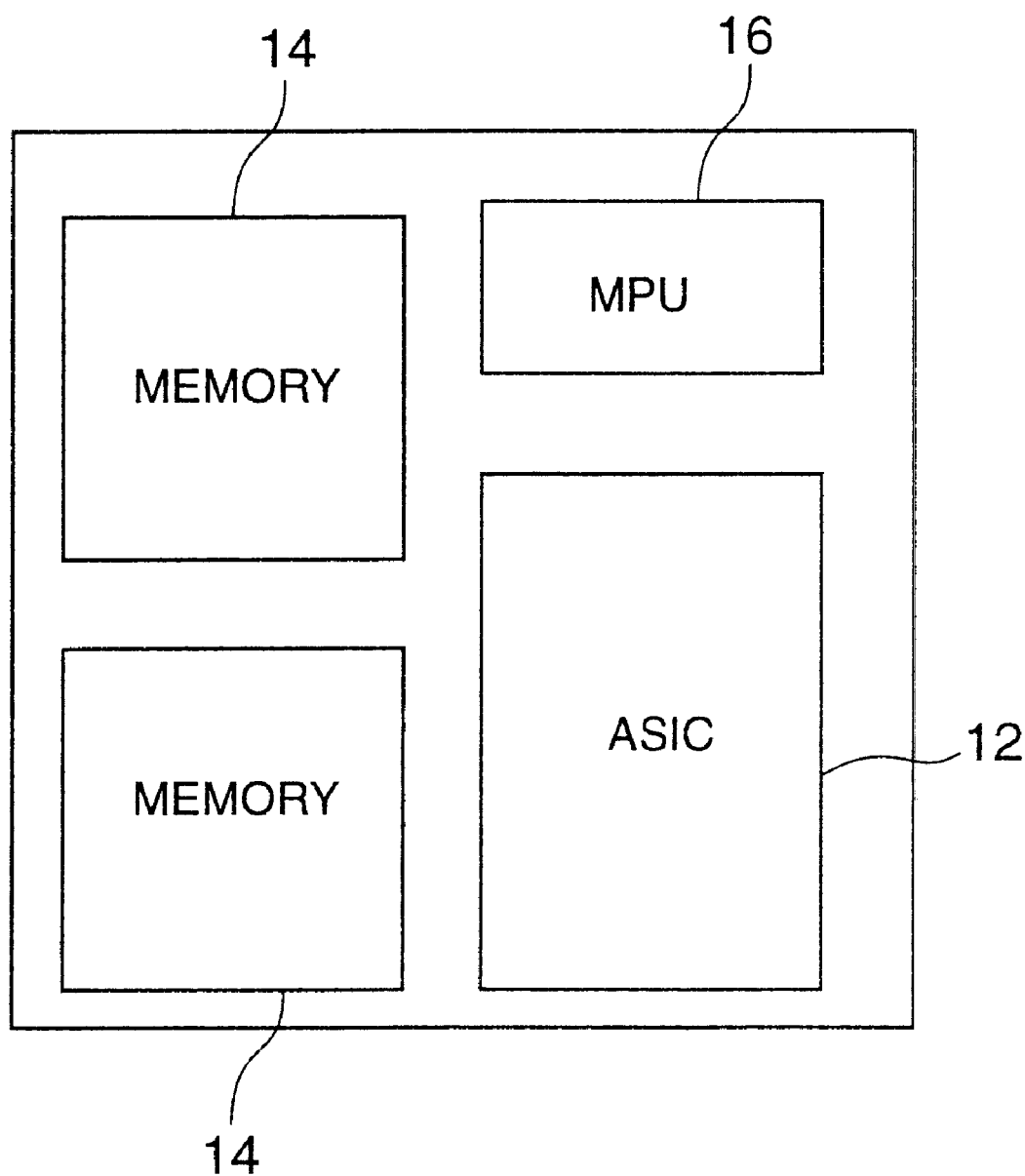
FIG. 12 is an illustration of a semiconductor device having a plurality of the same kind of semiconductor chips and a plurality of different kinds of semiconductor chips.

It should be noted that the structure of the semiconductor device according to the above-mentioned first embodiment and the structure of the semiconductor device according to the above-mentioned second embodiment can be combined. More specifically, for example as shown in FIG. 12, a plurality of memories 14 (two memories in the example shown in FIG. 12), the ASIC 12 and the MPU 16 are gathered and electrically connected to each other by forming the redistribution layer so as to integrally package those semiconductor chips. According to this structure, advantages of both the first embodiment and the second embodiment can be achieved by a single semiconductor device.

A description will now be given of a third embodiment of the present invention. A semiconductor device according to the third embodiment of the present invention comprises a semiconductor chip 52 and a semiconductor chip 54 stacked on the semiconductor chip 52 so as to package the semiconductor chips 52 and 54 as a single semiconductor device.

Figure 13:
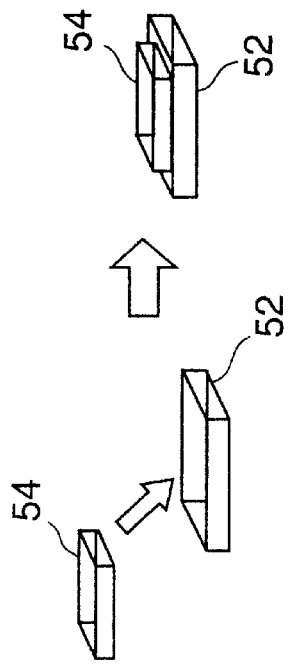
FIG. 13 is an illustration for explaining a process of stacking semiconductor chips to manufacture a semiconductor device according to a third embodiment of the present invention.

First, as shown in FIG. 13, the semiconductor chip 54 is mounted on the electrode surface of the semiconductor chip 52. Electrode pads 52a of the semiconductor chip 52 are arranged on the peripheral portion of the electrode surface. Accordingly, there is no electrode pad 52 is formed in the center of the electrode surface of the semiconductor chip 52. Since the semiconductor chip 54 is smaller than the semiconductor chip 52, the semiconductor 54 can be located within the center area of the semiconductor chip 52 in which the electrode pads are not provided. The semiconductor chip 54 is fixed to the semiconductor chip 52 by an adhesive 56 so that the back surface of the semiconductor chip 54 is attached to the semiconductor chip 52 and the electrode surface of the semiconductor chip 54 faces upwardly.

Figure 14B:
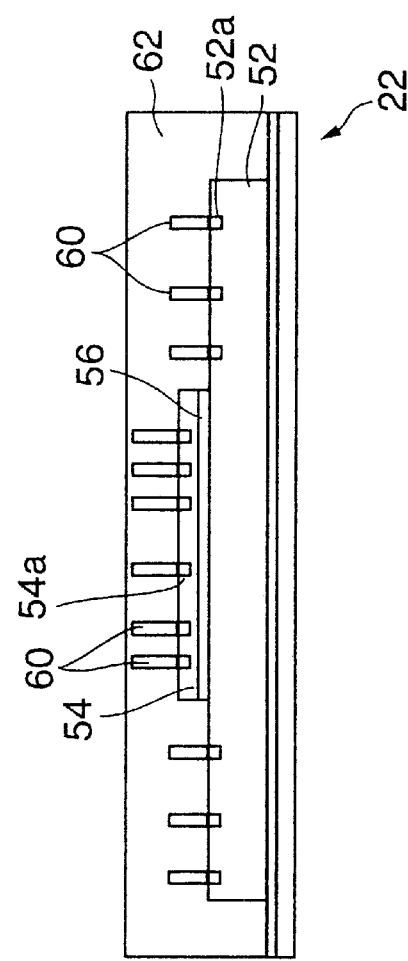
FIGS. 14A and 14B are illustrations of the semiconductor device according to the third embodiment of the present invention in a state in which copper posts are formed and sealed.
Figure 14A:
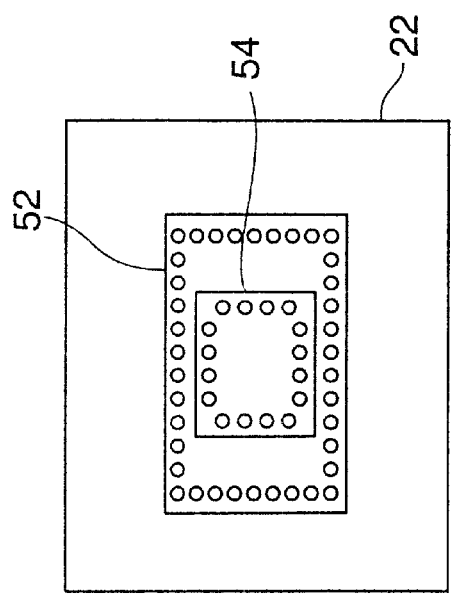

Thereafter, as shown in FIGS. 14A and 14B, copper posts 60 are formed on the electrode pads 52a of the semiconductor chip 52 and the electrode pads 54a of the semiconductor chip 54. The copper posts 60 formed on the electrode pads 52a are higher than the height (thickness) of the semiconductor chip 54. Thereafter, as shown in FIGS. 15A and 15B, the semiconductor chips 52 and 54 and the copper posts 60 are sealed by a sealing resin 62.

Then, as show in FIG. 15B, the surface of the sealing resin 62 is polished according to the CMP method so as to expose the copper posts 60 in the surface of the sealing resin 62. Next, as shown in FIGS. 16A and 16B, a redistribution layer 64 is formed on the surface of the sealing resin 62 and copper posts 66 are formed on the redistribution layer 64. Then, the copper posts 66 are sealed by a sealing resin 68, and the surface of the sealing resin 68 is flattened by the CMP method so as to expose the copper posts 66 in the surfaces of the sealing resin 68. Then, solder balls 70 are formed on the copper posts 60 exposed in the surface of the sealing resin 68. It should be noted that the redistribution layer 64, the copper posts 66, the sealing resin 68 and the solder balls 70 are formed in the same manner as that of the semiconductor device according to the first embodiment of the present invention, and descriptions thereof will be omitted.

In the semiconductor device according to the present embodiment, the semiconductor chips are packaged in the stacked state. Thus, a plurality of semiconductor chips can be integrated in a one-piece package without increasing the mounting area of the semiconductor device.

It should be noted that a plurality of lines indicated in the sealing resin 68 shown in FIG. 16A illustrate the wiring patterns provided on the redistribution layer 64. The wiring patterns extend over the semiconductor chips 52 and 54 so as to electrically connect the semiconductor chips 52 and 54 to each other.

In the above-mentioned third embodiment, each of the semiconductor chips 52 and 54 is cut out from respective wafer, and, thereafter, the semiconductor chip 54 is stacked on and fixed to the semiconductor chip 52. However, as show in FIG. 17, the only the semiconductor chip 54 is cut out from the wafer so as to stack on and fix to the semiconductor chip 52 in the wafer state.

Similar to the above-mentioned third embodiment, the semiconductor chip 52 in the wafer state on which the semiconductor chip 54 is fixed is subjected to the first copper post forming process, the first resin sealing process, the redistribution layer forming process, the second copper post forming process, the second resin forming process and the solder forming process. Thereafter, the wafer of the completed semiconductor device is cut into individual semiconductor devices as shown in FIG. 18.

A description will now be given of a fourth embodiment of the present invention. FIG. 19 is a cross-sectional view of a semiconductor device according to the fourth embodiment of the present invention.

The semiconductor device 80 shown in FIG. 19 has a three-layered structure. The first layer has the same structure as the semiconductor device 10 according to the first embodiment of the present invention as shown in FIG. 4B, and description thereof will be omitted. In the second layer, a semiconductor chip 82 is placed on a redistribution layer 84 in a state in which the semiconductor chip 82 overlaps the semiconductor chips 12, 14 and 16 provided in the first layer. The third layer has the same structure as that of the semiconductor device 10 shown in FIG. 7B which comprises the redistribution layer 18, the copper posts 32, the sealing resin 34 and the solder balls 36.

The first layer of the semiconductor device 80 is formed in the same manner as the structure of the semiconductor device 10 which comprises the mounting jig 22, the semiconductor chips 12, 14 and 16, the copper posts 26 and the sealing resin 28, as shown in FIG. 20A. The second layer of the semiconductor device 80 has the redistribution layer 84 formed on the sealing resin 28 of the first layer as shown in FIG. 19. Similar to the redistribution layer 18, the redistribution layer 84 has wiring patterns and lands. The semiconductor chips 12, 14 and 16 are connected to each other by the wiring patterns of the redistribution layer 84. The copper posts 86 are formed on the lands of the redistribution layer 84, and are sealed by the sealing resin 88.

In the above-mentioned structure, the lands are arranged on a peripheral part of the redistribution layer 84 by the wiring patterns of the redistribution layer 84. That is, the wiring patterns are formed so that the lands are not provided in the center portion of the surface of the redistribution layer 84, and the semiconductor chip 82 is fixed to the center portion by an adhesive. Thereafter, the copper posts 86 are formed on the lands of the redistribution layer 84 and the electrode pads of the semiconductor chip 82, and the copper posts 86 are sealed by the sealing resin 88. Thereafter, the sealing resin 88 is flattened by polishing according to the CMP method so as to expose the copper posts 86 in the surface of the sealing resin 88, and the second layer of the semiconductor device 80 is completed.

Thereafter, the third layer is formed on the thus-formed second layer. The third layer has the same structure as the structure of the semiconductor device which comprises the redistribution layer 18, the copper posts 32, the sealing resin 34 and the solder balls 36, and descriptions thereof will be omitted.

In the thus-formed semiconductor chip 80, the semiconductor chip 82 provided in the second layer is positioned on and fixed to the redistribution layer 86 so that the semiconductor chip 82 overlaps the semiconductor chips 12, 14 and 16. Accordingly, the mounting area of the semiconductor device 80 does not increase due to the addition of the semiconductor chip 82. Thus, by using the semiconductor device 80, more semiconductor chips can be mounted in a small mounting area.

It should be noted that a plurality of lines indicated in FIG. 20B indicate the wiring patterns provided on the redistribution layer 84. It can be appreciated from FIG. 20B that the wiring patterns of the redistribution layer 84 extend over a plurality of semiconductor chips. Additionally, a plurality of lines indicated in FIG. 20C indicate the wiring patterns provided on the redistribution layer 18. It can be appreciated from FIG. 20C that the wiring patterns of the redistribution layer 18 extend over the semiconductor chips 12, 14 and 18 of the first layer and the semiconductor chip 82 of the second layer.

Additionally, in the present embodiment, the semiconductor chip 82 of the second layer overlaps the semiconductor chips 12, 14 and 16 of the first layer in the center thereof. However, the present invention is not limited to this structure, and the semiconductor chip 82 of the second layer can be located in any position by changing the wiring patterns of the redistribution layer 84.

The present invention is not limited to the specifically disclosed embodiments, and variations and modifications may be made without departing from the scope of the present invention.

What is claimed is:

1. A manufacturing method of a semiconductor device, comprising the steps of:

arranging a plurality of semiconductor elements adjacent to each other;

forming a redistribution layer over the plurality of semiconductor elements so as to interconnect and integrally hold the plurality of semiconductor elements; and forming a plurality of projection electrodes on said redistribution layer for surface mounting, wherein the redistribution layer has a single wiring layer to interconnect the plurality of semiconductor elements and the plurality of projection electrodes, and wherein the redistribution layer and the plurality of semiconductor elements are combined into a single package.

2. A manufacturing method of a semiconductor device, comprising the steps of:

forming a plurality of semiconductor elements on a wafer;

forming a redistribution layer on the wafer so as to electrically interconnect a predetermined number of the semiconductor elements;

cutting out the predetermined number of the semiconductor elements from the wafer in one piece; and forming a plurality of projection electrodes on the redistribution layer for surface mounting, wherein the redistribution layer has a single wiring layer to interconnect the plurality of semiconductor elements and the plurality of projection electrodes, and wherein the redistribution layer and the plurality of semiconductor elements are combined into a single package.

3. A manufacturing method of a semiconductor device, comprising the steps of:

placing a first semiconductor element to an electrode surface of a second semiconductor element and fixing the first semiconductor element to the second semiconductor element, the first semiconductor element being smaller than the second semiconductor element;

forming a redistribution layer over the first and second semiconductor elements so as to electrically interconnect the first and second semiconductor elements; and forming a plurality of projection electrodes on the redistribution layer for surface mounting, wherein the redistribution layer has a single wiring layer to interconnect the first and second semiconductor elements and the projetion electrodes, and wherein the redistribution layer and the first and second semiconductor elements are combined into a single package.

* * * * *

UNITED STATES PATENT AND TRADEMARK OFFICE
CERTIFICATE OF CORRECTION

PATENT NO. : 6,627,479 B2
DATED : September 30, 2003
INVENTOR(S) : Aiba et al.

It is certified that error appears in the above-identified patent and that said Letters Patent is hereby corrected as shown below:

Title page,
Item [73], Assignee, change "Fujitsu, Limited, Kawasaki (JP)" to be -- Fujitsu Limited, Kawasaki (JP) --

Signed and Sealed this

Eighth Day of February, 2005

JON W. DUDAS
*Director of the United States Patent and Trademark Office*